United States Patent
Tang et al.

(10) Patent No.: US 10,984,839 B2
(45) Date of Patent: Apr. 20, 2021

(54) VOLTAGE REGULATION CIRCUIT

(71) Applicant: Huawei Technologies Co., Ltd., Shenzhen (CN)

(72) Inventors: Yangyang Tang, Shenzhen (CN); Enyi Yao, Shenzhen (CN); Chen-Xiong Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/559,959

(22) Filed: Sep. 4, 2019

(65) Prior Publication Data

US 2019/0392871 A1 Dec. 26, 2019

Related U.S. Application Data

(63) Continuation of application No. PCT/CN2017/097690, filed on Aug. 16, 2017.

(51) Int. Cl.
*G11C 16/26* (2006.01)
*G11C 5/14* (2006.01)
(Continued)

(52) U.S. Cl.
CPC .............. *G11C 5/147* (2013.01); *G05F 1/575* (2013.01); *G11C 7/10* (2013.01); *G11C 11/4074* (2013.01); *G11C 16/30* (2013.01)

(58) Field of Classification Search
CPC ..... G11C 7/10; G11C 11/4074; G11C 13/004; G11C 16/26; G11C 16/30; G11C 2213/70; G11C 5/145; G11C 8/08; G11C 5/147
See application file for complete search history.

(56) References Cited

U.S. PATENT DOCUMENTS 6,304,131 B1 10/2001 Huggins et al.
2009/0184697 A1 7/2009 Park
(Continued)

FOREIGN PATENT DOCUMENTS

CN 102598492 A 7/2012
CN 104079177 A 10/2014
(Continued)

OTHER PUBLICATIONS

Mori, K., "Analog-assisted digital low dropout regulator with fast transient response and low output ripple," Japanese Journal of Applied Physics, vol. 53, No. 4, Jan. 1, 2014, pp. 1-4, XP055712957.
(Continued)

*Primary Examiner* — Hien N Nguyen
(74) *Attorney, Agent, or Firm* — Conley Rose, P.C.

(57) ABSTRACT

A voltage regulation circuit includes a first comparison and control unit and a second comparison and control unit. The first comparison and control unit is connected to a first switch unit, determine a first bias voltage based on a first output voltage, a first reference voltage, and a second reference voltage, and control a value of an equivalent resistance of the first switch unit using the first bias voltage. The second comparison and control unit is connected to a third switch unit and the second switch unit, determine a second bias voltage based on the first output voltage, a second output voltage, and a third reference voltage, and control values of equivalent resistances of the third switch unit and the second switch unit using the second bias voltage.

20 Claims, 7 Drawing Sheets

(51) Int. Cl.
    *G05F 1/575*     (2006.01)
    *G11C 7/10*     (2006.01)
    *G11C 11/4074*     (2006.01)
    *G11C 16/30*     (2006.01)

(56) References Cited

U.S. PATENT DOCUMENTS

| | | | |
|---|---|---|---|
| 2011/0018510 A1* | 1/2011 | Gao | G05F 1/575 |
| | | | 323/280 |
| 2011/0109294 A1 | 5/2011 | Larson | |
| 2012/0062192 A1* | 3/2012 | Okuma | G05F 1/56 |
| | | | 323/272 |
| 2012/0086490 A1* | 4/2012 | Doo | H03K 19/00361 |
| | | | 327/291 |
| 2012/0105025 A1 | 5/2012 | Chen | |
| 2013/0169247 A1 | 7/2013 | Onouchi et al. | |
| 2014/0125300 A1 | 5/2014 | Price et al. | |
| 2014/0167813 A1 | 6/2014 | Raychowdhury et al. | |
| 2014/0266103 A1 | 9/2014 | Wang et al. | |
| 2015/0145495 A1* | 5/2015 | Tournatory | H02M 3/156 |
| | | | 323/282 |
| 2016/0099681 A1 | 4/2016 | Zong et al. | |
| 2017/0003699 A1* | 1/2017 | Lin | G05F 1/575 |
| 2017/0023966 A1* | 1/2017 | Kim | G05F 3/245 |
| 2017/0133182 A1 | 5/2017 | Hsiao | |
| 2019/0356325 A1 | 11/2019 | Hu et al. | |

FOREIGN PATENT DOCUMENTS

| | | |
|---|---|---|
| CN | 104850210 A | 8/2015 |
| CN | 104965555 A | 10/2015 |
| CN | 204835922 U | 12/2015 |
| CN | 106130557 A | 11/2016 |
| CN | 106774587 A | 5/2017 |
| CN | 107528576 A | 12/2017 |
| JP | H03169121 A | 7/1991 |
| JP | 2002244744 A | 8/2002 |
| JP | 2004343851 A | 12/2004 |
| JP | 2013003700 A | 1/2013 |
| JP | 2015533443 A | 11/2015 |
| JP | 2016511485 A | 4/2016 |
| WO | 2016173478 A1 | 11/2016 |

OTHER PUBLICATIONS

Machine Translation and Abstract of Chinese Publication No. CN104079177, Oct. 1, 2014, 15 pages.
Machine Translation and Abstract of Chinese Publication No. CN104850210, Aug. 19, 2015, 22 pages.
Machine Translation and Abstract of Chinese Publication No. CN106774587, May 31, 2017, 8 pages.
Lee, Y., et al, "8.3 A 200mA Digital Low-Drop-Out Regulator with Coarse-Fine Dual Loop in Mobile Application Processors," IEEE International Solid-State Circuits Conference (ISSCC), Feb. 2, 2016, 3 pages.
Ingino, J., et al, "A 4-GHz Clock System for a High-Performance System-on-a-Chip Design," IEEE Journal of Solid-State Circuits, vol. 36 , Issue: 11 , Nov. 2001, pp. 1693-1698.
Zarate-Roldan, J., et al, "A Capacitor-Less LDO With High-Frequency PSR Suitable for a Wide Range of On-Chip Capacitive Loads," IEEE Transactions on Very Large Scale Integration (VLSI) Systems, vol. 24, No. 9, Sep. 2016, pp. 2970-2982.
Zhang, C., et al, "A Low Dropout Regulator for SoC with High Power Supply Rejection and Low Quiescent Current," Proceedings of the 2009 12th International Symposium on Integrated Circuits, Feb. 2, 2010, pp. 37-40.
Zhan, C. et al, "A Low Dropout Regulator with Low Quiescent Current and High Power Supply Rejection over Wide Range of Frequency for SOC," Journal of Circuits, Systems, and Computers, vol. 20, No. 1, 2011, pp. 1-13.
Man, T., et al, "Development of Single-Transistor-Control LDO Based on Flipped Voltage Follower for SoC," IEEE Transactions on Circuits and Systems—I: Regular Papers, vol. 55, No. 5, Jun. 2008, pp. 1392-1401.
Nasir, S., et al, "Switched-Mode-Control Based Hybrid LDO for Fine-Grain Power Management of Digital Load Circuits," IEEE Journal of Solid-State Circuits, vol. 53, No. 2, Feb. 2018, pp. 569-581.
Foreign Communication From a Counterpart Application, PCT Application No. PCT/CN2017/097690, English Translation of International Search Report dated May 22, 2018, 2 pages.
Mori, K, et al, "Analog-assisted digital low dropout regulator AAD-LDO with 59% faster transient response and 28% ripple reduction," the Japan Society of applied physics, Mar. 28, 2014, 2 pages.

* cited by examiner

US 10,984,839 B2

VOLTAGE REGULATION CIRCUIT

CROSS-REFERENCE TO RELATED APPLICATION

This application is a continuation of International Application No. PCT/CN2017/097690, filed on Aug. 16, 2017, which is hereby incorporated by reference in its entirety.

TECHNICAL FIELD

This application relates to the field of integrated circuit technologies, and in particular, to a voltage regulation circuit.

BACKGROUND

With development of semiconductor processes, integrated circuits are widely applied. An integrated circuit usually works in different working scenarios with uncertainty. The different working scenarios with uncertainty are generally caused by changes of various factors, such as aging of an internal element in the integrated circuit and a temperature change, that affect normal working of the integrated circuit. In addition, the different working scenarios with uncertainty usually bring various disadvantages to the integrated circuit, for example, cause fluctuation of a working voltage in the integrated circuit. Consequently, system stability is affected. Therefore, to ensure that an integrated circuit can normally work under uncertainty, a working voltage in the integrated circuit needs to be regulated using a voltage regulation circuit.

A working voltage in an integrated circuit may be regulated using a voltage regulation circuit shown in FIG. 1, to ensure system stability. As shown in FIG. 1, the voltage regulation circuit includes a first switch unit 10, a second switch unit 20, a comparison and control unit 30, and a load 40. Both the first switch unit 10 and the second switch unit 20 have a voltage transformation function. The first switch unit 10 is connected to the load 40, and is configured to provide a first output voltage VVDD to the load 40. The second switch unit 20 is a mirror of the first switch unit 10, that is, the second switch unit 20 is a scaled-down structure of the first switch unit 10. A value of a second output voltage VDR output by the second switch unit 20 is equal to a value of the first output voltage VVDD that is not yet affected by fluctuation of the load. The comparison and control unit 30 is connected to the first switch unit 10 and the second switch unit 20, and is configured to collect the first output voltage VVDD and the second output voltage VDR, determine a bias voltage V1 based on the first output voltage VVDD, the second output voltage VDR, and a reference voltage $V_{ref}$, and control on states of the first switch unit 10 and the second switch unit 20 using the bias voltage V1, to regulate the first output voltage VVDD. Because the bias voltage V1 used for controlling the first switch unit 10 is determined by two voltages, the two voltages include a voltage output based on VDR and $V_{ref}$ and a voltage output based on VVDD and $V_{ref}$, and the second output voltage VDR does not fluctuate under impact of the load. Therefore, the voltage output based on VDR and the reference voltage can eliminate an error of the bias voltage V1 caused by fluctuation of the first output voltage VVDD, thereby ensuring the system stability.

During actual implementation, when the system stability is ensured, usually, how to implement a relatively wide output current range further needs to be considered based on an actual requirement. The relatively wide output current range means that a span of an output current is relatively large. For example, the output current range may be several milliamperes to several amperes. In addition, how to ensure a relatively high power supply rejection ratio (PSRR) in the wide output current range also becomes a hot spot of researches.

SUMMARY

To implement a relatively high PSRR in a wide output current range while ensuring system stability, this application provides a voltage regulation circuit. The technical solutions are as follows.

The voltage regulation circuit includes a first switch unit, a second switch unit, a third switch unit, a first comparison and control unit, a second comparison and control unit, and a load, and both the first switch unit and the second switch unit have a voltage transformation function.

Both the first switch unit and the second switch unit receive a voltage input from a power supply, and an equivalent resistance of the first switch unit is less than an equivalent resistance of the second switch unit.

The first switch unit and the second switch unit are further separately connected to the load, and are configured to provide a first output voltage to the load, and the first output voltage is voltages output by the first switch unit and the second switch unit.

The first comparison and control unit is connected to the first switch unit, and is configured to collect the first output voltage, determine a first bias voltage based on the first output voltage, a first reference voltage, and a second reference voltage, and control a value of the equivalent resistance of the first switch unit through digital control using the first bias voltage. The first reference voltage is greater than the second reference voltage. The second comparison and control unit is connected to the third switch unit and the second switch unit, and is configured to collect the first output voltage and a second output voltage, determine a second bias voltage based on the first output voltage, the second output voltage, and a third reference voltage, and control values of equivalent resistances of the third switch unit and the second switch unit through analog control using the second bias voltage. The third reference voltage is greater than the second reference voltage and less than the first reference voltage. The third switch unit is a mirror of a unit obtained after the second switch unit and the first switch unit are connected in parallel, and is configured to output the second output voltage, to eliminate an error of the second bias voltage that is caused by fluctuation of the load.

In an actual working process, the voltage regulation circuit may regulate the first output voltage using a branch in which the first switch unit is located, or may regulate the first output voltage using a branch in which the second switch unit is located. It can be learned based on a value relationship between the first reference voltage, the second reference voltage, and the third reference voltage that, when relatively large fluctuation occurs in the first output voltage, the first output voltage is regulated using the branch in which the first switch unit is located, and when relatively small fluctuation occurs in the first output voltage, the first output voltage is regulated using the branch in which the second switch unit is located.

In this embodiment of the present disclosure, the equivalent resistance of the first switch unit is less than the equivalent resistance of the second switch unit, and the first switch unit and the second switch unit are connected in parallel. Therefore, a current flowing through the branch in which the first switch unit is located is greater than a current flowing through the branch in which the second switch unit is located. The first switch unit under digital control works in a linear area, and it can be ensured that a relatively large current can flow through the first switch unit in a unit area, thereby implementing a wide output current capability. In addition, compared with digital control, analog control can be used to control the second switch unit to increase an equivalent transconductance output by the second switch unit, and the transconductance is in direct proportion to the PSRR. Therefore, a relatively high PSRR is ensured by controlling the branch in which the second switch unit is located. In addition, although the first switch unit is under digital control, when relatively small fluctuation occurs, the first comparison and control unit does not control switch transistors in the first switch unit to be on. Therefore, the branch does not affect the PSRR of the system, that is, the branch does not cause a decrease of the PSRR of the system.

When a quantity of switches included in the first switch unit is greater than a quantity of switches included in the second switch unit, the equivalent resistance of the first switch unit is less than the equivalent resistance of the second switch unit, or when both the first switch unit and the second switch unit are switch units including metal-oxide semiconductor (MOS) transistors and an aspect ratio of the MOS transistor included in the first switch unit is greater than an aspect ratio of the MOS transistor included in the second switch unit, the equivalent resistance of the first switch unit is less than the equivalent resistance of the second switch unit.

That is, during actual implementation, the quantity of switches in the first switch unit and the quantity of switches in the second switch unit may be set to implement that the equivalent resistance of the first switch unit is less than the equivalent resistance of the second switch unit, or the aspect ratio of the MOS transistor in the first switch unit and the aspect ratio of the MOS transistor in the second switch unit may be set to implement that the equivalent resistance of the first switch unit is less than the equivalent resistance of the second switch unit, thereby improving implementation flexibility.

In addition, the third switch unit includes a first mirror switch unit and a second mirror switch unit, a quantity of switches included in the first mirror switch unit is 1/N of the quantity of switches included in the first switch unit, a quantity of switches included in the second mirror switch unit is 1/N of the quantity of switches included in the second switch unit, and N is a positive integer greater than 1. The voltage regulation circuit further includes a mirror resistor, and a value of the mirror resistor is 1/N of a resistor included in the load.

For ease of process implementation, during specific implementation, a quantity of mirror switch units included in the third switch unit may be scaled down, that is, quantities of switches included in the third switch unit are respectively set to 1/N of the quantity of switches included in the first switch unit and 1/N of the quantity of switches included in the second switch unit. In this way, a process is simplified.

Further, when both the first switch unit and the second switch unit are switch units including metal-oxide semiconductor MOS transistors, an aspect ratio of an MOS transistor included in the first mirror switch unit is 1/N of an aspect ratio of the MOS transistor included in the first switch unit, and an aspect ratio of an MOS transistor included in the second mirror switch unit is 1/N of an aspect ratio of the MOS transistor included in the second switch unit.

A width and a length of an MOS transistor may affect a value of a current flowing through the MOS transistor. Therefore, to implement the third switch unit, in this implementation, the aspect ratio of the MOS transistor included in a mirrored third switch unit may be set to 1/N of the aspect ratio of the MOS transistor that is before mirroring is performed. In this way, the process is also simplified.

Further, during specific implementation, the voltage regulation circuit further includes a fourth switch unit, the fourth switch unit includes a plurality of switches, the fourth switch unit is serially connected between the second switch unit and the load, and the fourth switch unit is configured to increase an equivalent resistance of a branch in which the second switch unit is located, to reduce a current flowing through the second switch unit, and correspondingly, the third switch unit is a mirror of a unit obtained after the second switch unit, the first switch unit, and the fourth switch unit are connected to each other.

To ensure that the current flowing through the branch in which the second switch unit is located is relatively small, the equivalent resistance of the branch in which the second switch unit is located may be increased. Therefore, the fourth switch unit is serially connected between the second switch unit and the load. In an embodiment, an input end of the fourth switch unit is connected to an output end of the second switch unit, and an output end of the fourth switch unit is connected to the load. In this way, it can be ensured that the current flowing through the branch in which the second switch unit is located is sufficiently small.

In a possible implementation, the fourth switch unit is connected to the first comparison and control unit such that a value of an equivalent resistance of the fourth switch unit is controlled using the first bias voltage determined by the first comparison and control unit.

Alternatively, in another possible implementation, the fourth switch unit is connected to the second comparison and control unit such that a value of an equivalent resistance of the fourth switch unit is controlled using the second bias voltage determined by the second comparison and control unit.

That is, during actual implementation, the fourth switch unit may be controlled through different implementations based on actual requirements. In this way, the implementation flexibility may be improved.

During specific implementation, when the first comparison and control unit includes a window comparator, the window comparator is configured to, when the first output voltage is greater than the first reference voltage, determine the first bias voltage based on the first reference voltage and the first output voltage, or when the first output voltage is less than the second reference voltage, determine the first bias voltage based on the second reference voltage and the first output voltage.

That is, the first comparison and control unit may be implemented using the window comparator. If the first output voltage is greater than the first reference voltage, the voltage regulation circuit controls the value of the equivalent resistance of the first switch unit using the first bias voltage determined based on the first output voltage and the first reference voltage. During actual implementation, a larger value of the determined first bias voltage, that is, a larger difference between the first output voltage and the first reference voltage, indicates that the equivalent resistance of the first switch unit needs to be controlled to be larger. That is, in a possible implementation, more switches in the first switch unit need to be controlled to be off.

If the first output voltage is less than the second reference voltage, the voltage regulation circuit controls the value of the equivalent resistance of the first switch unit using the first bias voltage determined based on the first output voltage and the second reference voltage. During actual implementation, a smaller value of the determined first bias voltage, that is, a smaller difference between the first output voltage and the first reference voltage, indicates that the equivalent resistance of the first switch unit needs to be controlled to be smaller. That is, in a possible implementation, more switches in the first switch unit need to be controlled to be on.

In this embodiment of the present disclosure, the first comparison and control unit controls the first switch unit using the window comparator such that when relatively large fluctuation occurs in the first output voltage, the first output voltage is regulated using a branch in which the first switch unit is located.

In addition, the second comparison and control unit includes a first amplification module, a second amplification module, and a third amplification module. The first amplification module is connected to the second amplification module and the third amplification module, and the second amplification module is connected to the second switch unit after being connected to the third amplification module. The voltage regulation circuit further includes a feedback compensation unit. The feedback compensation unit is connected to the second switch unit, the second amplification module, and the third amplification module, and is configured to perform, using a feedback compensation capacitor included in the feedback compensation unit, feedback compensation for a branch in which the second amplification module is located and a branch in which the third amplification module is located.

To implement performance of a high bandwidth, a high PRSS, and low noise, during specific implementation, in this embodiment of the present disclosure, the second switch unit is controlled by the second comparison and control unit using a circuit shown in FIG. 5. The first amplification module is a module including a transistor and having an amplification function. Noise is in direct proportion to a size of the transistor. That is, if the size of the transistor included in the first amplification module is larger, generated noise is lower, otherwise, if the size of the transistor included in the first amplification module is smaller, generated noise is higher. Therefore, in this embodiment of the present disclosure, to achieve low noise, an amplification function module including a relatively thick transistor is used as the first amplification module, that is, usually, the size of the transistor included in the first amplification module is relatively large.

When the size of the transistor included in the first amplification module is relatively large, a bandwidth of the first amplification module is reduced. To remedy a disadvantage of the bandwidth, referring to FIG. 6, FIG. 6 is a diagram of a circuit implemented according to an example of an embodiment. Herein, a positive output end of the first amplification module is connected to the third amplification module, and a negative output end of the first amplification module is connected to the second amplification module. In addition, an output of the second amplification module is connected to an output of the third amplification module, and both the second amplification module and the third amplification module are connected in a buffer connection manner, that is, an output end of the second amplification module is connected to a positive input end of the second amplification module, and an output end of the third amplification module is connected to a negative input end of the third amplification module. In this way, impedance of the output end of the second amplification module and impedance of the output end of the third amplification module are reduced, thereby increasing the bandwidth.

In addition, the voltage regulation circuit further includes a feedback compensation unit, and the feedback compensation unit includes a capacitor Cm, a G4 module, and a G5 module. An output end of the G4 module is connected to the third amplification module, and the G4 module and Cm are configured to perform feedback compensation for the branch in which the third amplification module is located. An output end of the G5 module is connected to the second amplification module, and the G5 module and Cm are configured to perform feedback compensation for the branch in which the second amplification module is located. This ensures stability of a branch loop in which the second amplification module is located and a branch loop in which the third amplification module is located.

The technical solutions provided in this application have the following beneficial effects.

In the voltage regulation circuit provided in this application, when the power supply starts to supply power, the first switch unit and the second switch unit output the first output voltage to the load. To ensure stability of the first output voltage, the voltage regulation circuit may control, using the first comparison and control unit, the first switch unit to perform voltage regulation, or control, using the second comparison and control unit, the second switch unit to perform voltage regulation. That is, the voltage regulation circuit may collect the first output voltage using the first comparison and control unit, and control the value of the equivalent resistance of the first switch unit through digital control based on the first output voltage, the first reference voltage, and the second reference voltage, to regulate the first output voltage. Alternatively, the voltage regulation circuit may collect the first output voltage and the second output voltage using the second comparison and control unit, and control the values of the equivalent resistances of the third switch unit and the second switch unit through analog control based on the first output voltage, the second output voltage, and the third reference voltage, to regulate the first output voltage. The equivalent resistance of the first switch unit is less than the equivalent resistance of the second switch unit, that is, the current flowing through the branch in which the first switch unit is located is greater than the current flowing through the branch in which the second switch unit is located. The first switch unit under digital control works in the linear area, and it can be ensured that a relatively large current can flow through the first switch unit in a unit area, thereby implementing the wide output current capability. In addition, compared with digital control, analog control can increase the equivalent transconductance output by the second switch unit, and the transconductance is in direct proportion to the PSRR. Therefore, a relatively high PSRR is ensured by controlling the branch in which the second switch unit is located. In addition, the third reference voltage is greater than the second reference voltage and less than the first reference voltage. That is, when relatively large fluctuation occurs in the first output voltage, voltage regulation is performed using the branch in which the first switch unit is located, and when relatively small fluctuation occurs in the first output voltage, voltage regulation is performed using the branch in which the second switch unit is located. In this way, although the first switch unit is under digital control, the first comparison and control unit does not control, when relatively small fluctuation occurs, the switch transistors in the first switch unit to be on. Therefore, the branch does not affect the PSRR of the system, that is, the branch does not cause a decrease of the PSRR of the system.

REFERENCE NUMERALS

1: First switch unit,
2: Second switch unit,
3: Third switch unit,
4: First comparison and control unit,
5: Second comparison and control unit,
6: Load,
7: Fourth switch unit,
8: Feedback compensation unit,
41: Window comparator,
51: First amplifier, 52: Second amplifier,
G1: First amplification module, G2: Second amplification module, and G3: Third amplification module.

DESCRIPTION OF EMBODIMENTS

To make the objectives, technical solutions, and advantages of this application clearer, the following further describes the implementations of this application in detail with reference to the accompanying drawings.

Before embodiments of the present disclosure are described in detail, an application scenario of the embodiments of the present disclosure is described first. In a working process of a voltage regulation circuit, a PSRR is one of important parameters that need to be considered. The PSRR can represent an anti-noise capability of the voltage regulation circuit. A larger value of the PSRR indicates a stronger anti-noise capability of the voltage regulation circuit, and the stronger anti-noise capability indicates a more stable system. The embodiments of the present disclosure provide a voltage regulation circuit. The voltage regulation circuit can ensure relatively high PSRR performance in a wide output current range.

Figure 1:
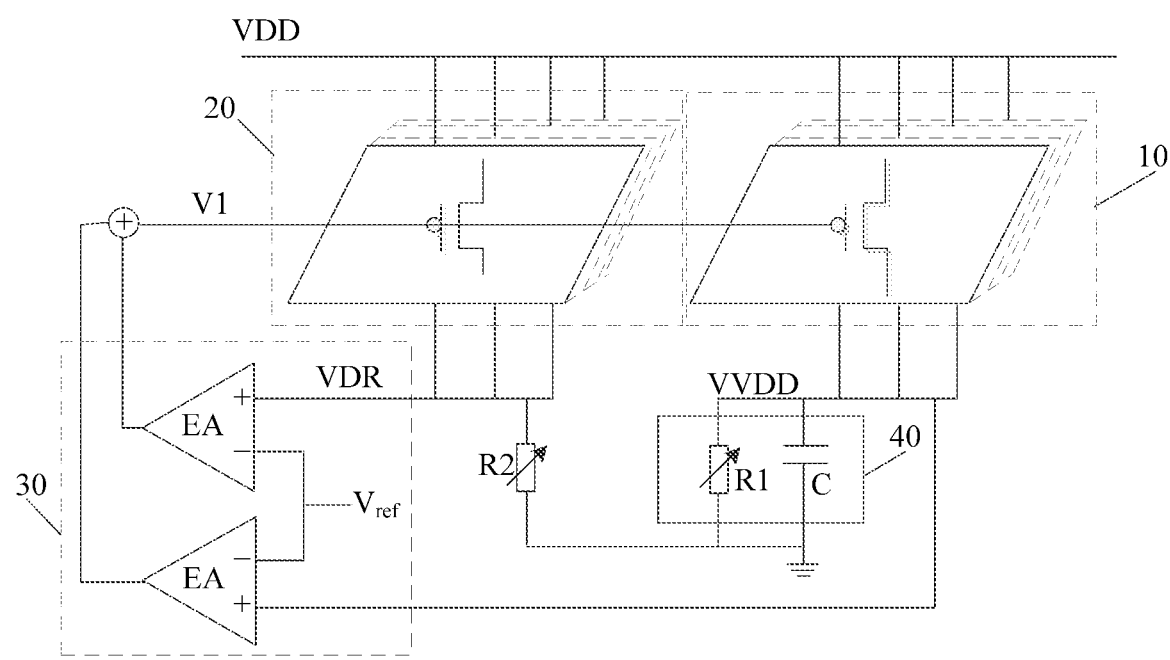
FIG. 1 shows a voltage regulation circuit according to an example of an embodiment.
Figure 2:
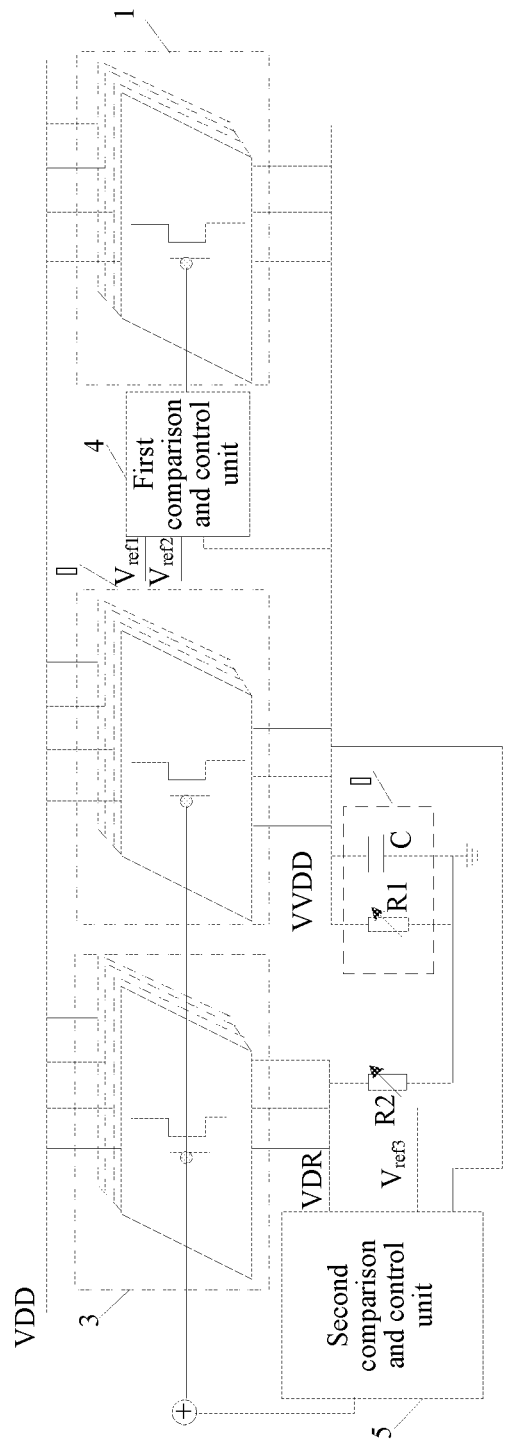
FIG. 2 shows a voltage regulation circuit according to another example of an embodiment.

FIG. 2 is a schematic structural diagram of a voltage regulation circuit according to an embodiment of the present disclosure. Referring to FIG. 2, the voltage regulation circuit includes a first switch unit 1, a second switch unit 2, a third switch unit 3, a first comparison and control unit 4, a second comparison and control unit 5, and a load 6. Both the first switch unit 1 and the second switch unit 2 have a voltage transformation function.

Both the first switch unit 1 and the second switch unit 2 receive a voltage input from a power supply VDD, and an equivalent resistance of the first switch unit 1 is less than an equivalent resistance of the second switch unit 2. Each switch transistor in the first switch unit 1 and the second switch unit 2 is equivalent to a resistor. In an optional embodiment, a switch unit usually includes a plurality of paths and switch transistors (such as diodes) that are connected in series or parallel on the plurality of paths. In this case, an equivalent resistance of the switch unit is a total resistance of the switch transistors on the conducted paths. Further, values of equivalent resistances of two switch units may be compared by comparing total resistances of the two switch units. For example, if the first switch unit 1 includes a plurality of serially connected switch transistors, and the second switch unit 2 includes one switch transistor, a value of a total resistance of the plurality of serially connected switch transistors in the first switch unit 1 is determined, and then the total resistance is compared with an equivalent resistance of the switch transistor in the second switch unit 2. In an embodiment, a parallel connection principle is the same as a series connection principle. In addition, the first switch unit 1 and the second switch unit 2 are further separately connected to the load 6, and are configured to provide a first output voltage VVDD to the load 6. The first output voltage VVDD is voltages output by the power supply VDD through the first switch unit 1 and the second switch unit 2.

The third switch unit 3 receives a voltage input from the power supply VDD, and outputs a second output voltage VDR. The third switch unit 3 is a mirror of a unit obtained after the first switch unit 1 and the second switch unit 2 are connected in parallel. A value of the second output voltage VDR output by the third switch unit 3 is equal to a value of the first output voltage VVDD before the first output voltage VVDD fluctuates to eliminate, using the second output voltage VDR, an error of the second bias voltage that is caused by the fluctuation of the load 6. In this way, system stability is ensured using the third switch unit 3. The second bias voltage is used to control the second switch unit 2. Details are as follows.

In the voltage regulation circuit, the first comparison and control unit 4 is connected to the first switch unit 1, and is configured to control the value of the equivalent resistance of the first switch unit 1 through digital control. The second comparison and control unit 5 is connected to the third switch unit 3 and the second switch unit 2. The second comparison and control unit 5 is configured to control values of equivalent resistances of the second switch unit 2 and the third switch unit 3 through analog control.

It should be noted that in this embodiment of the present disclosure, when the value of the equivalent resistance of the switch unit is controlled through digital control, it usually indicates that a quantity of turned-on switches of a plurality of switches included in the switch unit is controlled, or when the value of the equivalent resistance of the switch unit is controlled through analog control, it usually indicates that a value of a gate voltage of the switch unit is controlled, thereby controlling a value of a current flowing through the switch unit.

Based on the foregoing descriptions, in the voltage regulation circuit provided in this embodiment of the present disclosure, if the first output voltage VVDD fluctuates due to impact of the load, the first output voltage VVDD may be regulated using a branch in which the first switch unit 1 is located and a branch in which the second switch unit 2 is located. It should be noted that in the voltage regulation circuit, the equivalent resistance of the first switch unit 1 is less than the equivalent resistance of the second switch unit 2, and the first switch unit 1 and the second switch unit 2 are connected in parallel. Therefore, a current flowing through the branch in which the first switch unit 1 is located is greater than a current flowing through the branch in which the second switch unit 2 is located. Under digital control, a bias voltage of a gate of the first switch unit 1 is controlled to be a low voltage or a high voltage. For example, the low voltage and the high voltage are respectively "0" and "1". That is, when the first switch unit 1 is on, the voltage of the gate of the first switch unit 1 is a low voltage, or when the first switch unit 1 is not on, the voltage of the gate of the first switch unit 1 is a high voltage. Therefore, the first switch unit 1 under digital control works in a linear area. In this way, a relatively large current can flow through the first switch unit 1 in a unit area, thereby ensuring that a wide current output range can be implemented using the voltage regulation circuit. The unit area herein means a single switch transistor included in the first switch unit 1.

In addition, compared with that under digital control, a current flowing through the second switch unit 2 needs to be relatively small when the second switch unit 2 is controlled through analog control in a same output current case. Therefore, a quantity of transistors in the second switch unit 2 needs to be increased, and the quantity of the transistors is in direct proportion to an equivalent transconductance. That is, the equivalent transconductance output by the second switch unit 2 may be increased, and the transconductance is in direct proportion to a PSRR. Therefore, a relatively high PSRR is ensured by controlling the branch in which the second switch unit 2 is located.

During actual implementation, a branch that is used to perform voltage regulation may be selected based on a change range of the first output voltage VVDD. Referring to FIG. 2, a plurality of reference voltages, including a first reference voltage $V_{ref1}$, a second reference voltage $V_{ref2}$, and a third reference voltage $V_{ref3}$, are set for the voltage regulation circuit.

The first reference voltage $V_{ref1}$ is greater than the second reference voltage $V_{ref2}$, and the third reference voltage $V_{ref3}$ is greater than the second reference voltage $V_{ref2}$ and less than the first reference voltage $V_{ref1}$. During actual implementation, a value of the third reference voltage $V_{ref3}$ may be set to an actually required voltage of the load. In addition, the first reference voltage $V_{ref1}$ may be the third reference voltage $V_{ref3}$ plus a fixed value $\Delta V$, and the second reference voltage $V_{ref2}$ may be the third reference voltage $V_{ref3}$ minus the fixed value $\Delta V$, that is, $V_{ref1}=V_{ref3}+\Delta V$, and $V_{ref2}=V_{ref3}-\Delta V$, where $\Delta V$ may be preset depending on an actual circuit requirement. For example, if the actually required voltage of the load is 9 V, the third reference voltage $V_{ref3}$ may be set to 9 V, and $\Delta V$ may be set to 1 V. In this case, the first reference voltage $V_{ref1}$ is 10 V, and the second reference voltage $V_{ref2}$ is 8 V.

If the first output voltage VVDD is greater than the first reference voltage $V_{ref1}$ or less than the second reference voltage $V_{ref2}$, it may be considered that relatively large fluctuation occurs in the first output voltage VVDD. If it is determined through comparison that there is a difference between the first output voltage VVDD and the third reference voltage $V_{ref3}$, that is, the first output voltage VVDD is between the first reference voltage $V_{ref1}$ and the second reference voltage $V_{ref2}$, it may be considered that relatively small fluctuation occurs in the first output voltage VVDD. That is, it can be learned based on a value relationship between the first reference voltage $V_{ref1}$, the second reference voltage $V_{ref2}$, and the third reference voltage $V_{ref3}$ that, when relatively large fluctuation occurs in the first output voltage VVDD, the first output voltage VVDD is regulated using the branch in which the first switch unit 1 is located, and when relatively small fluctuation occurs in the first output voltage VVDD, the first output voltage VVDD is regulated using the branch in which the second switch unit 2 is located.

The following describes specific implementations of regulating the first output voltage VVDD using the branch in which the first switch unit 1 is located, and regulating the first output voltage VVDD using the branch in which the second switch unit 2 is located. Details are as follows.

First, the implementation of regulating the first output voltage VVDD using the branch in which the first switch unit 1 is located is described in detail. An implementation process includes the first comparison and control unit 4 is connected to the first switch unit 1, and is configured to collect the first output voltage VVDD, determine a first bias voltage based on the first output voltage VVDD, the first reference voltage $V_{ref1}$, and the second reference voltage $V_{ref2}$, and control the value of the equivalent resistance of the first switch unit through digital control using the first bias voltage.

When the power supply VDD starts to supply power, the first output voltage VVDD output by the first switch unit 1 and the second switch unit 2 is provided to the load 6, that is, a load input voltage is provided to the load 6. In the process, if the first output voltage VVDD is greater than the first reference voltage $V_{ref1}$ or less than the second reference voltage $V_{ref2}$, it indicates that relatively large fluctuation occurs in the first output voltage VVDD. In this case, the voltage regulation circuit collects the first output voltage VVDD using the first comparison and control unit 4, and determines the first bias voltage based on the first output voltage VVDD, the first reference voltage $V_{ref1}$, and the second reference voltage $V_{ref2}$. Then, the value of the equivalent resistance of the first switch unit 1 is controlled using the first bias voltage through digital control.

Figure 3:
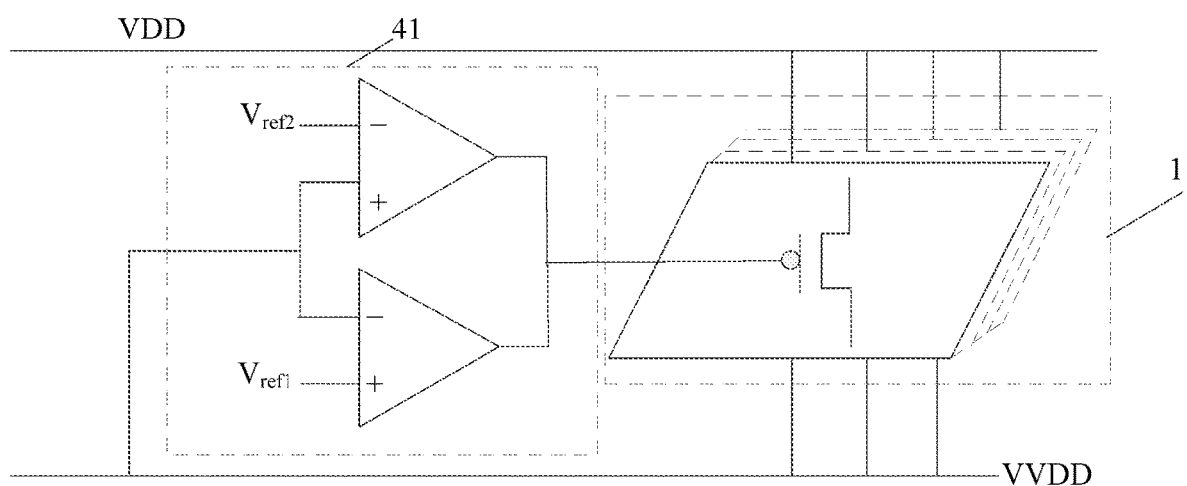
FIG. 3 is a schematic diagram of a connection between a first switch unit and a first comparison and control unit according to an example of an embodiment.

During specific implementation, the first comparison and control unit 4 may include a window comparator 41. Referring to FIG. 3, that the switch transistor of the first switch unit is a P-type transistor is used as an example for description. When the first output voltage VVDD is greater than the first reference voltage $V_{ref1}$, the first bias voltage is determined based on the first reference voltage $V_{ref1}$ and the first output voltage VVDD, or when the first output voltage VVDD is less than the second reference voltage $V_{ref2}$, the first bias voltage is determined based on the second reference voltage $V_{ref2}$ and the first output voltage VVDD.

That is, if the first output voltage VVDD is greater than the first reference voltage $V_{ref1}$, the voltage regulation circuit controls the value of the equivalent resistance of the first switch unit 1 using the first bias voltage determined based on the first output voltage VVDD and the first reference voltage $V_{ref1}$. During actual implementation, a larger value of the determined first bias voltage, that is, a larger difference between the first output voltage VVDD and the first reference voltage $V_{ref1}$, indicates that the equivalent resistance of the first switch unit 1 needs to be controlled to be larger. That is, in a possible implementation, more switches in the first switch unit 1 need to be controlled to be off.

Further, a specific implementation of determining the first bias voltage based on the first reference voltage $V_{ref1}$ and the first output voltage VVDD includes comparing, by the window comparator 41, the first reference voltage $V_{ref1}$ with the first output voltage VVDD, to determine a difference between the first reference voltage $V_{ref1}$ and the first output voltage VVDD, and then determining, by the window comparator 41, the difference as the first bias voltage.

If the first output voltage VVDD is less than the second reference voltage $V_{ref2}$, the voltage regulation circuit controls the value of the equivalent resistance of the first switch unit 1 using the first bias voltage determined based on the first output voltage VVDD and the second reference voltage $V_{ref2}$. During actual implementation, a smaller value of the determined first bias voltage, that is, a smaller difference between the first output voltage VVDD and the second reference voltage $V_{ref2}$, indicates that the equivalent resistance of the first switch unit 1 needs to be controlled to be smaller. That is, in a possible implementation, more switches in the first switch unit 1 need to be controlled to be on.

Further, a specific implementation of determining the first bias voltage based on the second reference voltage $V_{ref2}$ and the first output voltage VVDD includes comparing, by the window comparator 41, the first output voltage VVDD with the second reference voltage $V_{ref2}$, to determine a difference between the first output voltage VVDD and the second reference voltage $V_{ref2}$, and then determining, by the window comparator 41, the difference as the first bias voltage.

In addition, it should be noted that, if the first output voltage VVDD is between the first reference voltage $V_{ref1}$ and the second reference voltage $V_{ref2}$, the value of the equivalent resistance of the first switch unit 1 remains unchanged. In a possible implementation, it is ensured that a quantity of turned-on switches of a plurality of switches included in the first switch unit 1 remains unchanged. That is, if the first output voltage VVDD is between the first reference voltage $V_{ref1}$ and the second reference voltage $V_{ref2}$, it indicates that relatively small fluctuation occurs in the first output voltage VVDD. When relatively small fluctuation occurs in the first output voltage VVDD, the value of the equivalent resistance of the first switch unit 1 remains changed. In this way, it is ensured that the first switch unit 1 does not affect the PSRR of the system. That is, although the first switch unit 1 is under digital control, the first switch unit 1 does not cause a decrease of the PSRR of the system when the system reaches a stable state.

Further, a specific implementation of controlling the value of the equivalent resistance of the first switch unit 1 through digital control using the first bias voltage includes determining, by the first comparison and control unit 4, the first bias voltage, and obtaining digital control information corresponding to a bias voltage range of the first bias voltage from a stored correspondence between the bias voltage range and digital control information. Then, the value of the equivalent resistance of the first switch unit 1 is controlled using the obtained digital control information. That is, the switches in the first switch unit 1 are controlled to be on and off to control the value of the equivalent resistance of the first switch unit 1. Digital control information may include binary "0" and "1". For the P-type transistor, "0" indicates that the switch is on, and "1" indicates that the switch is off.

It should be noted that, although the first switch unit 1 in under digital control, when relatively small fluctuation occurs in the first output voltage VVDD, the first comparison and control unit 4 does not control the switch transistor in the first switch unit 1 to be on. Therefore, the branch does not affect the PSRR of the system, that is, the branch does not cause a decrease of the PSRR of the system.

It should be noted that the switch transistor under digital control works in a linear area. Therefore, a relatively large current flows through the switch transistor under digital control in a unit area, that is, a response speed to the relatively large current can be increased by controlling the first switch unit 1 through digital control, thereby achieving a relatively strong transient response capability.

The following details the implementation of regulating the first output voltage VVDD using the branch in which the second switch unit 2 is located An implementation process includes the second comparison and control unit 5 is connected to the second switch unit 2, and is configured to collect the first output voltage VVDD and the second output voltage VDR, determine a second bias voltage based on the first output voltage VVDD, the second output voltage VDR, and the third reference voltage $V_{ref3}$, and control the value of the equivalent resistance of the second switch unit 2 through analog control using the second bias voltage.

When the power supply VDD starts to supply power, the first output voltage VVDD output by the first switch unit 1 and the second switch unit 2 is provided to the load 6, that is, a load input voltage is provided to the load 6. In the process, if the first output voltage VVDD is between the first reference voltage $V_{ref1}$ and the second reference voltage $V_{ref2}$, it indicates that relatively small fluctuation occurs in the first output voltage VVDD. In this case, the voltage regulation circuit collects, using the second comparison and control unit 5, the first output voltage VVDD and the second output voltage VDR that is output by the third switch unit 3, and determines the second bias voltage based on the first output voltage VVDD, the second output voltage VDR, and the third reference voltage $V_{ref3}$. Then, the values of the equivalent resistances of the third switch unit 3 and the second switch unit 2 are controlled using the second bias voltage, thereby regulating the first output voltage VVDD.

It should be noted that in this embodiment of the present disclosure, during actual implementation, the second comparison and control unit 5 is always in a working state. When relatively small fluctuation occurs, the first comparison and control unit 4 does not control the switch transistor in the first switch unit 1 to be on. Therefore, in this case, the first output voltage VVDD is regulated using the branch in which the second switch unit 2 is located. In an embodiment, when relatively large fluctuation occurs, the second comparison and control unit 5 is also in the working state. Because the equivalent resistance of the first switch unit 1 is less than the equivalent resistance of the second switch unit 2, a current flowing through the branch in which the first switch unit 1 is located in a unit time is relatively large, that is, the first switch unit 1 plays a leading role. Therefore, when relatively large fluctuation occurs, the first output voltage VVDD is regulated by actually using the branch in which the first switch unit 1 is located.

In addition, it should be further noted that, in this embodiment of the present disclosure, that the second comparison and control unit 5 is always in the working state is only used as an example for description. During actual implementation, when relatively large fluctuation occurs, the second comparison and control unit 5 may alternatively be controlled not to work. For example, the first comparison and control unit 4 may output a control signal to the second comparison and control unit 5, to use the control signal to control the second comparison and control unit 5 not to work. This is not limited in this embodiment of the present disclosure.

Figure 4:
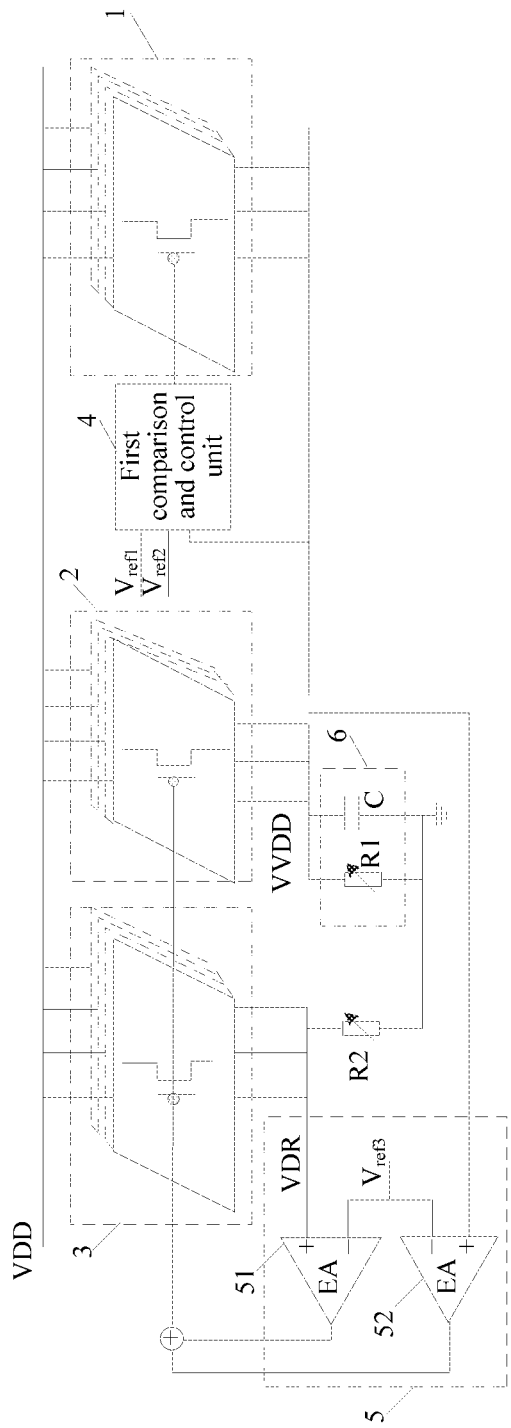
FIG. 4 shows a voltage regulation circuit according to another example of an embodiment.

During specific implementation, referring to FIG. 4, the second comparison and control unit 5 may include a first amplifier 51 and a second amplifier 52. A first input end of the first amplifier 51 is connected to an output end of the third switch unit 3, to collect the second output voltage. A second input end of the first amplifier 51 is connected to the third reference voltage $V_{ref3}$, to collect the third reference voltage $V_{ref3}$. The first amplifier 51 determines and outputs a voltage based on the collected second output voltage VDR and the collected third reference voltage $V_{ref3}$.

In addition, a first input end of the second amplifier 52 is connected to an output end of the first switch unit 1 or the second switch unit 2, and is configured to collect the first output voltage VVDD output by the first switch unit 1 or the second switch unit 2. A second input end of the second amplifier 52 is also connected to the third reference voltage $V_{ref3}$, to collect the third reference voltage $V_{ref3}$. The second amplifier 52 determines and outputs another voltage based on the collected first output voltage VVDD and the collected third reference voltage $V_{ref3}$.

Further, an output end of the first amplifier 51 and an output end of the second amplifier 52 are connected together. That is, the second bias voltage actually includes two voltages, and the two voltages are respectively the voltage output by the first amplifier 51 and the voltage output by the second amplifier 52. The voltage output by the first amplifier 51 is the same as the voltage output by the second amplifier 52. The second bias voltage is used to control gate voltages of the second switch unit 2 and the third switch unit 3 to control the values of the equivalent resistances of the second switch unit 2 and the third switch unit 3 through analog control based on the second bias voltage, thereby regulating the first output voltage VVDD.

Based on the foregoing descriptions, if it is determined through comparison that there is a difference between the first output voltage VVDD and the third reference voltage $V_{ref3}$, it may be considered that relatively small fluctuation occurs in the first output voltage VVDD. In this case, voltage regulation is performed on the first output voltage VVDD using the branch in which the second switch unit 2 is located.

Figure 5:
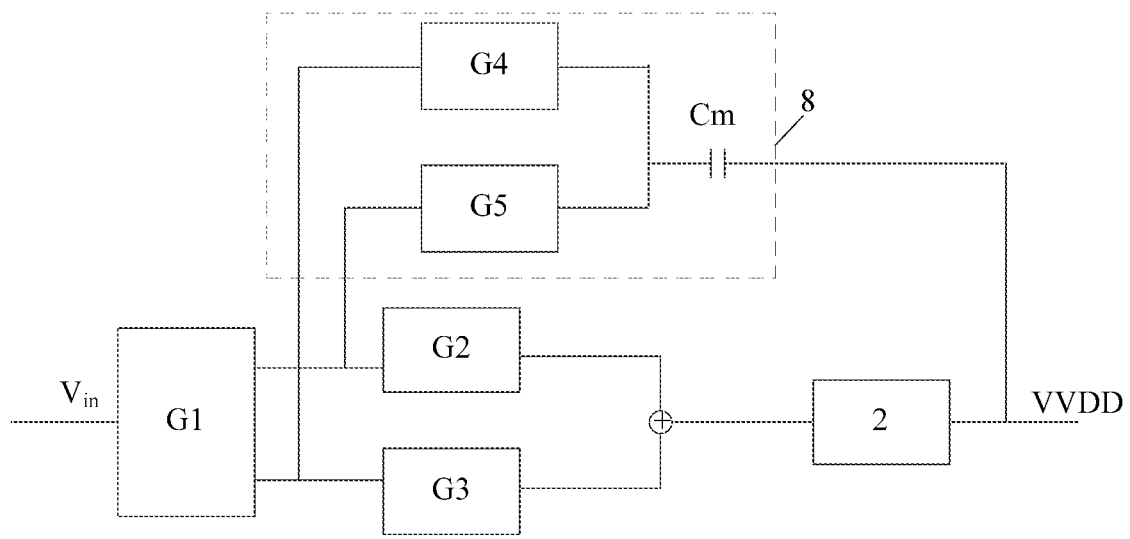
FIG. 5 is a diagram of a connection principle between a second comparison and control unit and a second switch unit according to an example of an embodiment.

Further, referring to FIG. 5, the second comparison and control unit 5 includes a first amplification module G1, a second amplification module G2, and a third amplification module G3. The first amplification module 1 is connected to the second amplification module G2 and the third amplification module G3, and the second amplification module G2 is connected to the second switch unit 2 after being connected to the third amplification module G3. The voltage regulation circuit further includes a feedback compensation unit 8. The feedback compensation unit 8 is connected to the second switch unit 2, the second amplification module G2, and the third amplification module G3, and is configured to perform, using a feedback compensation capacitor Cm included in the feedback compensation unit 8, feedback compensation for a branch in which the second amplification module G2 is located and a branch in which the third amplification module G3 is located.

During actual implementation, to implement performance of a high bandwidth, a high PRSS, and low noise, during specific implementation, in this embodiment of the present disclosure, the second switch unit 2 is controlled by the second comparison and control unit 5 using a circuit shown in FIG. 5. The first amplification module G1 is a module including a transistor and having an amplification function. Because noise is in direct proportion to a size of the transistor, that is, if the size of the transistor included in the first amplification module G1 is larger, generated noise is lower, otherwise, if the size of the transistor included in the first amplification module G1 is smaller, generated noise is higher. Therefore, in this embodiment of the present disclosure, to achieve low noise, a module including a relatively thick transistor and having an amplification function is used as the first amplification module G1, that is, usually, the size of the transistor included in the first amplification module G1 is relatively large.

Figure 6:
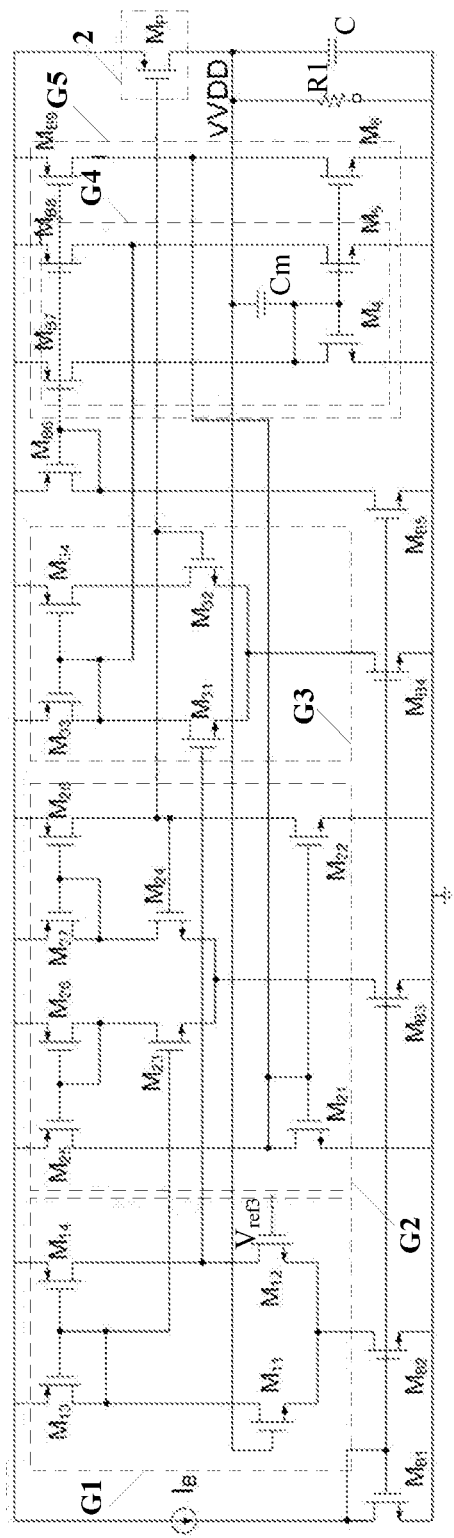
FIG. 6 is a diagram of a connection circuit between a second comparison and control unit and a second switch unit according to an example of an embodiment.

When the size of the transistor included in the first amplification module G1 is relatively large, a bandwidth of the first amplification module G1 is reduced. To overcome a bandwidth defect, referring to FIG. 6, FIG. 6 is a circuit diagram of a specific implementation according to an example of an embodiment. Herein, a positive output end of the first amplification module G1 is connected to the third amplification module G3, and a negative output end of the first amplification module G1 is connected to the second amplification module G2. In addition, an output of the second amplification module G2 is connected to an output of the third amplification module G3, and both the second amplification module G2 and the third amplification module G3 are connected in a buffer connection manner. That is, an output end of the second amplification module G2 is connected to a positive input end of the second amplification module G2, and an output end of the third amplification module G3 is connected to a negative input end of the third amplification module G3. In this way, impedance of the output end of the second amplification module G2 and impedance of the output end of the third amplification module G3 are reduced, thereby increasing the bandwidth.

In addition, to ensure stability of a branch loop in which the second amplification module G2 is located and a branch loop in which the third amplification module G3 is located, the voltage regulation circuit further includes the feedback compensation unit 8. As shown in FIG. 5, during specific implementation, the feedback compensation unit 8 includes the capacitor Cm, a G4 module, and a G5 module. An output end of the G4 module is connected to the third amplification module G3, and the G4 module and Cm are configured to perform feedback compensation for the branch in which the third amplification module G3 is located. An output end of the G5 module is connected to the second amplification module G2, and the G5 module and Cm are configured to perform feedback compensation for the branch in which the second amplification module G2 is located.

It should be noted that the G4 module and the G5 module may be current sources or other amplification units. This is not limited in this embodiment of the present disclosure. For example, referring to FIG. 6, FIG. 6 shows specific implementations of the G4 module and the G5 module in an actual circuit.

It should be further noted that, only a specific implementation of controlling the second switch unit 2 by the second comparison and control unit 6 is used as an example herein for description. During actual implementation, the embodiment shown in FIG. 5 or FIG. 6 may be applied to a specific implementation of controlling a switch unit by a comparison and control unit of any structure.

It should be noted that the third switch unit 3 is a mirror obtained after the second switch unit 2 and the first switch unit 1 are connected in parallel. During specific implementation, there are the following two cases.

First case: The third switch unit 3 includes a first mirror switch unit and a second mirror switch unit, a quantity of switches included in the first mirror switch unit is 1/N of a quantity of switches included in the first switch unit 1, and a quantity of switches included in the second mirror switch unit is 1/N of a quantity of switches included in the second switch unit 2. Further, the voltage regulation circuit further includes a mirror resistor, and a value of the mirror resistor R2 is 1/N of a resistor R1 included in the load, where N is a positive integer greater than 1.

That is, for ease of process implementation, during specific implementation, the mirror switch units included in the third switch unit 3 may be scaled down, that is, the quantities of switches included in the third switch unit 3 are respectively set to 1/N of the quantity of switches included in the first switch unit 1 and 1/N of the quantity of switches included in the second switch unit 2.

Second case: When both the first switch unit 1 and the second switch unit 2 are switch units including metal-oxide semiconductors (MOS), an aspect ratio of an MOS transistor included in the first mirror switch unit is 1/N of an aspect ratio of the MOS transistor included in the first switch unit 1, and an aspect ratio of an MOS transistor included in the second mirror switch unit is 1/N of an aspect ratio of the MOS transistor included in the second switch unit 2.

A width and a length of the MOS transistor may affect a value of a current flowing through the MOS transistor. To implement the third switch unit 3, in this implementation, the aspect ratio of the MOS transistor included in the mirrored third switch unit 3 may be set to 1/N of the MOS transistor that is before mirroring is performed.

In an embodiment, it should be noted that an example in which both the first switch unit 1 and the second switch unit 2 are switch units including only MOS transistors is merely used for description. In another embodiment, the first switch unit 1 and the second switch unit 2 may alternatively include other switches. For example, the first switch unit 1 and the second switch unit 2 may alternatively include triodes. This is not limited in this embodiment of the present disclosure.

In addition, as described above, the equivalent resistance of the first switch unit 1 is less than the equivalent resistance of the second switch unit 2. During specific implementation, when the quantity of switches included in the first switch unit 1 is greater than the quantity of switches included in the second switch unit 2, the equivalent resistance of the first switch unit 1 is less than the equivalent resistance of the second switch unit 2.

Alternatively, when both the first switch unit 1 and the second switch unit 2 are switch units including MOS transistors, and an aspect ratio of the MOS transistor included in the first switch unit 1 is greater than an aspect ratio of the MOS transistor included in the second switch unit 2, the equivalent resistance of the first switch unit 1 is less than the equivalent resistance of the second switch unit 2.

Further, the voltage regulation circuit may further include a fourth switch unit 7. The fourth switch unit 7 includes a plurality of switches. The fourth switch unit 7 is serially connected between the second switch unit 2 and the load 6, and the fourth switch unit 7 is configured to increase the equivalent resistance of the branch in which the second switch unit 2 is located, to reduce a current flowing through the second switch unit 2.

Figure 7:
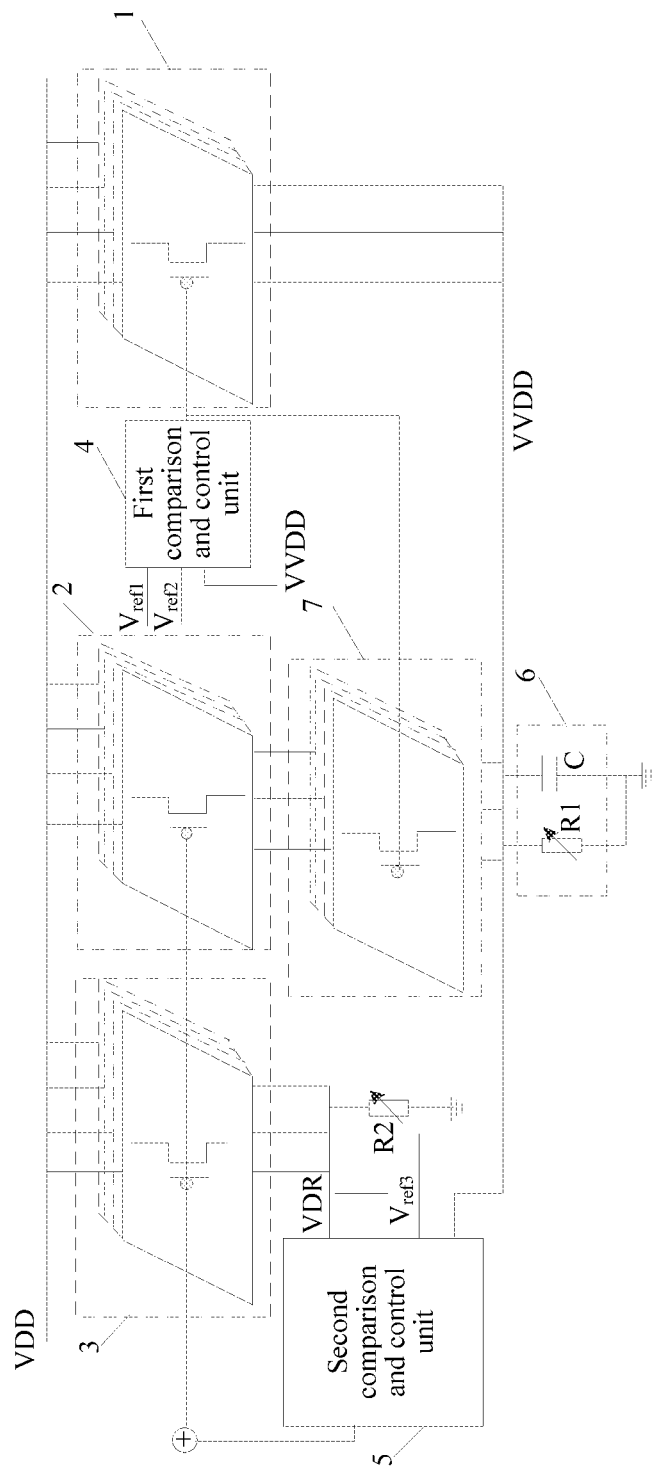
FIG. 7 shows a voltage regulation circuit according to another example of an embodiment.

Referring to FIG. 7, to ensure that the current flowing through the branch in which the second switch unit 2 is located is relatively small, the equivalent resistance of the branch in which the second switch unit 2 is located may be increased. To achieve this purpose, the fourth switch unit 7 is serially connected between the second switch unit 2 and the load 6. In an embodiment, an input end of the fourth switch unit 7 is connected to an output end of the second switch unit 2, and an output end of the fourth switch unit 7 is connected to the load 6.

During specific implementation, a value of an equivalent resistance of the fourth switch unit 7 may be controlled in a plurality of manners. The following several possible implementations may be included.

First case: The fourth switch unit 7 is connected to the first comparison and control unit 4 such that the value of the equivalent resistance of the fourth switch unit 7 is controlled using the first bias voltage determined by the first comparison and control unit 4.

During specific implementation, a gate of the fourth switch unit 7 is connected to an output end of the first comparison and control unit 4 such that the value of the equivalent resistance of the fourth switch unit 7 is controlled using the first bias voltage determined and output by the first comparison and control unit 4.

Second case: The fourth switch unit 7 is connected to the second comparison and control unit 5 such that the value of the equivalent resistance of the fourth switch unit 7 is controlled using the second bias voltage determined by the second comparison and control unit 5.

During specific implementation, a gate of the fourth switch unit 7 is connected to an output end of the second comparison and control unit 5 such that the value of the equivalent resistance of the fourth switch unit 7 is controlled using the second bias voltage determined and output by the second comparison and control unit 5.

It should be noted that an example in which the value of the equivalent resistance of the fourth switch unit 7 is controlled using the first bias voltage determined by the first comparison and control unit 4 or the value of the equivalent resistance of the fourth switch unit 7 is controlled using the second bias voltage determined by the second comparison and control unit 5 is merely used for descriptions in the foregoing descriptions. In another possible implementation, the voltage regulation circuit further includes a third comparison and control unit, and the third comparison and control unit is connected to the fourth switch unit 7. In this case, the value of the equivalent resistance of the fourth switch unit 7 may be controlled by the voltage regulation circuit using the third comparison and control unit. This is not limited in this embodiment of the present disclosure.

In addition, it should be further noted that, when the voltage regulation circuit includes the fourth switch unit 7, the third switch unit 3 is a mirror of a unit obtained after the second switch unit 2, the first switch unit 1, and the fourth switch unit 7 are connected to each other.

In this case, the third switch unit 3 includes a first mirror switch unit, a second mirror switch unit, and a fourth mirror switch unit. A quantity of switches included in the first mirror switch unit is 1/N of the quantity of switches included in the first switch unit 1, a quantity of switches included in the second mirror switch unit is 1/N of the quantity of switches included in the second switch unit 2, and a quantity of switches included in the fourth mirror switch unit is 1/N of a quantity of switches included in the fourth switch unit 7.

Alternatively, when all of the first switch unit 1, the second switch unit 2, and the fourth switch unit 7 are switch units including metal-oxide semiconductor MOS transistors, an aspect ratio of an MOS transistor included in the first mirror switch unit is 1/N of the aspect ratio of the MOS transistor included in the first switch unit 1, an aspect ratio of an MOS transistor included in the second mirror switch unit is 1/N of the aspect ratio of the MOS transistor included in the second switch unit 2, and an aspect ratio of an MOS transistor included in the fourth mirror switch unit is 1/N of an aspect ratio of an MOS transistor included in the fourth switch unit 7.

In the voltage regulation circuit provided in this application, when the power supply starts to supply power, the first switch unit and the second switch unit output the first output voltage to the load. To ensure stability of the first output voltage, the voltage regulation circuit may control, using the first comparison and control unit, the first switch unit to perform voltage regulation, or control, using the second comparison and control unit, the second switch unit to perform voltage regulation. That is, the voltage regulation circuit may collect the first output voltage using the first comparison and control unit, and control the value of the equivalent resistance of the first switch unit through digital control based on the first output voltage, the first reference voltage, and the second reference voltage, to regulate the first output voltage. Alternatively, the voltage regulation circuit may collect the first output voltage and the second output voltage using the second comparison and control unit, and control the values of the equivalent resistances of the third switch unit and the second switch unit through analog control based on the first output voltage, the second output voltage, and the third reference voltage, to regulate the first output voltage. The equivalent resistance of the first switch unit is less than the equivalent resistance of the second switch unit, that is, the current flowing through the branch in which the first switch unit is located is greater than the current flowing through the branch in which the second switch unit is located. The first switch unit under digital control works in the linear area, and it can be ensured that a relatively large current can flow through the first switch unit in a unit area, thereby implementing a wide output current capability. In addition, compared with digital control, analog control can increase the equivalent transconductance output by the second switch unit, and the transconductance is in direct proportion to the PSRR. Therefore, a relatively high PSRR is ensured by controlling the branch in which the second switch unit is located. In addition, the third reference voltage is greater than the second reference voltage and less than the first reference voltage. That is, when relatively large fluctuation occurs in the first output voltage, voltage regulation is performed using the branch in which the first switch unit is located, and when relatively small fluctuation occurs in the first output voltage, voltage regulation is performed using the branch in which the second switch unit is located. In this way, although the first switch unit is under digital control, the first comparison and control unit does not control, when relatively small fluctuation occurs, the switch transistors in the first switch unit to be on. Therefore, the branch does not affect the PSRR of the system, that is, the branch does not cause a decrease of the PSRR of the system.

The foregoing descriptions are embodiments provided in this application, but are not intended to limit this application. Any modification, equivalent replacement, or improvement made without departing from the spirit and principle of this application should fall within the protection scope of this application.

What is claimed is:

1. A voltage regulation circuit, comprising:
    a first switch configured to receive a voltage input from a power supply and provide a first output voltage to a load;
    a second switch configured to receive the voltage input from the power supply and provide the first output voltage to the load, wherein the first switch and the second switch have a voltage transformation function, and wherein an equivalent resistance of the first switch is less than an equivalent resistance of the second switch; and
    a first comparison and control circuit coupled to the first switch and configured to:
        collect the first output voltage;
        determine a first bias voltage based on the first output voltage, a first reference voltage, and a second reference voltage; and
        control a value of the equivalent resistance of the first switch through digital control using the first bias voltage, wherein the first reference voltage is greater than the second reference voltage; and
    a second comparison and control circuit coupled to a third switch of the voltage regulation circuit and the second switch, wherein the second comparison and control circuit is configured to:
        collect the first output voltage and a second output voltage;
        determine a second bias voltage based on the first output voltage, the second output voltage, and a third reference voltage; and
        control values of an equivalent resistance of the third switch and the equivalent resistance of the second switch through analog control using the second bias voltage, wherein the third reference voltage is greater than the second reference voltage and less than the first reference voltage, and
    wherein the third switch is a mirror of a circuit obtained after the second switch and the first switch are connected in parallel, and wherein the third switch is configured to output the second output voltage to eliminate an error of the second bias voltage that is caused by fluctuation of the load.

2. The voltage regulation circuit according to claim 1, wherein a quantity of switches comprised in the first switch is greater than a quantity of switches comprised in the second switch, and wherein the equivalent resistance of the first switch is less than the equivalent resistance of the second switch.

3. The voltage regulation circuit according to claim 1, wherein the first switch and the second switch comprise metal-oxide-semiconductor (MOS) transistors, wherein an aspect ratio of the MOS transistor comprised in the first switch is greater than an aspect ratio of the MOS transistor comprised in the second switch, and wherein the equivalent resistance of the first switch is less than the equivalent resistance of the second switch.

4. The voltage regulation circuit according to claim 1, wherein the third switch comprises a first mirror switch and a second mirror switch, wherein a quantity of switches comprised in the first mirror switch is 1/N of a quantity of switches comprised in the first switch, wherein a quantity of switches comprised in the second mirror switch is 1/N of a quantity of switches comprised in the second switch, and wherein N is a positive integer greater than 1, wherein the voltage regulation circuit further comprises a mirror resistor, and wherein a value of the mirror resistor is 1/N of a resistor comprised in the load.

5. The voltage regulation circuit according to claim 1, wherein the first switch and the second switch include metal-oxide-semiconductor (MOS) transistors, wherein an aspect ratio of a MOS transistor comprised in the first mirror switch is 1/N of an aspect ratio of the MOS transistor comprised in the first switch, and wherein an aspect ratio of a MOS transistor comprised in the second mirror switch is 1/N of an aspect ratio of the MOS transistor comprised in the second switch.

6. The voltage regulation circuit according to claim 1, further comprising a fourth switch, wherein the fourth switch comprises a plurality of switches and is serially connected between the second switch and the load, wherein the fourth switch is configured to increase an equivalent resistance of a branch in which the second switch is located to reduce a current flowing through the second switch, and wherein, the third switch is a mirror of a circuit obtained after the second switch, the first switch, and the fourth switch are interconnected.

7. The voltage regulation circuit according to claim 6, wherein the fourth switch is connected to the first comparison and control circuit such that an equivalent resistance of the fourth switch is controlled using the first bias voltage.

8. The voltage regulation circuit according to claim 6, wherein the fourth switch is connected to the second comparison and control circuit such that an equivalent resistance of the fourth switch is controlled using the second bias voltage.

9. The voltage regulation circuit according to claim 1, wherein the first comparison and control circuit is configured to determine the first bias voltage based on the first reference voltage and the first output voltage in response to the first output voltage being greater than the first reference voltage.

10. The voltage regulation circuit according to claim 1, wherein the first comparison and control circuit is configured to determine the first bias voltage based on the second reference voltage and the first output voltage in response to the first output voltage being less than the second reference voltage.

11. The voltage regulation circuit according to claim 1, wherein the second comparison and control circuit comprises a first amplification circuit, a second amplification circuit, and a third amplification circuit, wherein the first amplification circuit is connected to the second amplification circuit and the third amplification circuit, wherein the second amplification circuit is connected to the second switch after being connected to the third amplification circuit, and wherein the voltage regulation circuit further comprises a feedback compensation circuit connected to the second switch, the second amplification circuit, and the third amplification circuit, wherein the feedback compensation circuit comprises a feedback compensation capacitor configured to perform feedback compensation for a branch in which the second amplification circuit is located and a branch in which the third amplification circuit is located.

12. A circuit, comprising:
a first switch configured to receive a voltage input from a power supply and provide a first output voltage to a load;
a second switch configured to receive the voltage input from the power supply and provide the first output voltage to the load, wherein the first switch and the second switch have a voltage transformation function, and wherein an equivalent resistance of the first switch is less than an equivalent resistance of the second switch;
a first comparison and control circuit coupled to the first switch and configured to:
collect the first output voltage;
determine a first bias voltage based on the first output voltage, a first reference voltage, and a second reference voltage; and
control a value of the equivalent resistance of the first switch through digital control using the first bias voltage, wherein the first reference voltage is greater than the second reference voltage; and
a second comparison and control circuit coupled to a third switch of the voltage regulation circuit and the second switch, wherein the second comparison and control circuit is configured to:
collect the first output voltage and a second output voltage;
determine a second bias voltage based on the first output voltage, the second output voltage, and a third reference voltage; and
control values of an equivalent resistance of the third switch and the equivalent resistance of the second switch analog control using the second bias voltage, wherein the third reference voltage is greater than the second reference voltage and less than the first reference voltage.

13. The circuit according to claim 12, wherein the third switch is a mirror of a circuit obtained after the second switch and the first switch are connected in parallel, and wherein the third switch is configured to output the second output voltage to eliminate an error of the second bias voltage that is caused by fluctuation of the load.

14. The circuit according to claim 12, wherein a quantity of switches comprised in the first switch is greater than a quantity of switches comprised in the second switch, and wherein the equivalent resistance of the first switch is less than the equivalent resistance of the second switch.

15. The circuit according to claim 12, wherein the first switch and the second switch metal-oxide-semiconductor (MOS) transistors, wherein an aspect ratio of the MOS transistor comprised in the first switch is greater than an aspect ratio of the MOS transistor comprised in the second switch, and wherein the equivalent resistance of the first switch is less than the equivalent resistance of the second switch.

16. The circuit according to claim 12, wherein the third switch comprises a first mirror switch and a second mirror switch, wherein a quantity of switches comprised in the first mirror switch is 1/N of a quantity of switches comprised in the first switch, wherein a quantity of switches comprised in the second mirror switch is 1/N of a quantity of switches comprised in the second switch, and wherein N is a positive integer greater than 1, wherein the voltage regulation circuit further comprises a mirror resistor, and wherein a value of the mirror resistor is 1/N of a resistor comprised in the load.

17. The circuit according to claim 12, wherein the first switch and the second switch include metal-oxide semiconductor (MOS) transistors, wherein an aspect ratio of an MOS transistor comprised in the first mirror switch is 1/N of an aspect ratio of the MOS transistor comprised in the first switch, and wherein an aspect ratio of an MOS transistor comprised in the second mirror switch is 1/N of an aspect ratio of the MOS transistor comprised in the second switch.

18. The circuit according to claim 12, further comprising a fourth switch, wherein the fourth switch comprises a plurality of switches and is serially connected between the second switch and the load, wherein the fourth switch is configured to increase an equivalent resistance of a branch in which the second switch is located to reduce a current flowing through the second switch, and wherein, the third switch is a mirror of a circuit obtained after the second switch, the first switch, and the fourth switch are interconnected.

19. The circuit according to claim 18, wherein the fourth switch is connected to the first comparison and control circuit such that an equivalent resistance of the fourth switch is controlled using the first bias voltage.

20. The circuit according to claim 12, wherein the fourth switch is connected to the second comparison and control circuit such that an equivalent resistance of the fourth switch is controlled using the second bias voltage.

* * * * *